United States Patent
Liedenbaum et al.

[11] Patent Number: 6,054,725
[45] Date of Patent: Apr. 25, 2000

[54] ORGANIC ELECTROLUMINESCENT DEVICE

[75] Inventors: Coen T. H. F. Liedenbaum; Hermannus F. M. Schoo, both of Eindhoven, Netherlands

[73] Assignee: U.S. Philips Corporation, New York, N.Y.

[21] Appl. No.: 09/158,609

[22] Filed: Sep. 22, 1998

[30] Foreign Application Priority Data

Sep. 24, 1997 [EP] European Pat. Off. ............. 97202920

[51] Int. Cl.[7] .................................................. H01L 33/00
[52] U.S. Cl. ............................... 257/91; 257/40; 257/88; 257/89; 257/103; 313/498; 313/510; 313/504; 313/507
[58] Field of Search ................... 313/498, 500, 313/505, 510, 507; 257/88, 89, 91, 103, 40; 345/45, 206

[56] References Cited

U.S. PATENT DOCUMENTS

| | | | |
|---|---|---|---|
| 3,325,664 | 6/1967 | Buck, Jr. et al. ..................... | 313/510 |
| 3,566,391 | 2/1971 | Lally .................................... | 345/45 |
| 3,573,532 | 4/1971 | Boucher ............................... | 313/509 |
| 5,247,190 | 9/1993 | Friend et al. ........................ | 257/40 |
| 5,965,980 | 10/1999 | Hagiwara et al. ................... | 313/506 |

FOREIGN PATENT DOCUMENTS

| | | |
|---|---|---|
| 0278757A2 | 8/1988 | European Pat. Off. . |
| 0553950A2 | 8/1993 | European Pat. Off. . |
| 9608047A2 | 3/1996 | WIPO . |
| 9706223A1 | 2/1997 | WIPO . |

*Primary Examiner*—John Guay
*Attorney, Agent, or Firm*—John C. Fox

[57] ABSTRACT

An organic electroluminescent device (1) has an organic emitter layer (5) disposed between, on the one side, a common electrode (6) and, on the other side, a first and second electrode (3A, 3B) which are mutually interlaced and independently driveable. When driven by means of, respectively, the first and second electrode (3A, 3B), respectively, a first and second pattern-wise light-emitting surface emerges. Using different light-emitting patterns, optionally in combination with light-absorbing patterns, a group of icons differing in color and/or shape can be displayed selectively using the same part of a display area.

9 Claims, 5 Drawing Sheets

ORGANIC ELECTROLUMINESCENT DEVICE

BACKGROUND OF THE INVENTION

The invention relates to an electroluminescent device exhibiting a pattern-wise light-emitting surface when driven, said electroluminescent device comprising an organic emitter layer having an electroluminescent area, a first electrode layer and a second electrode layer,
said organic emitter layer being disposed between said first and said second electrode layer.

An electroluminescent (EL) device as mentioned in the opening paragraph is disclosed in, for example, the International Patent Application WO 97/06223. The known EL device is an EL device in which the electroluminescence originates from an organic compound, or an organic EL device for short. The known organic EL device comprises a polyphenylenevinylene emitter layer disposed between an indium tin oxide (ITO) and an indium electrode layer. The organic emitter layer comprises electroluminescent areas in accordance with a desired pattern. When driven, the surface of the EL device emits light in accordance with said desired pattern. Alternatively, the electrode layers may be structured according to the desired pattern.

The EL device disclosed in International Patent Application WO 97/06223 is particularly suitable to display icons. An icon is a specific high-resolution image having a fixed shape and color (scheme) which can be switched (partially) on or off. It may take the form of a pictogram, a word like "STOP" or "GO", or a number. Alternatively, it may be an area having a color which is different from the color of the area surrounding it. Icons are a clear and attractive means to convey information and are abundantly used in, for example, segmented display devices where they provide information complementary to the information provided by the segmented display area of the display device.

A disadvantage of the known EL device is that if a group of icons is to be accommodated, a relatively large display area will be required. This is of particular concern in portable applications, such as the display panel of a mobile phone, where display area is at a premium. Also, from the viewpoint of design and/or ergonomy it may be less attractive to have a large part of the display area occupied by a group of icons of which many, due to the nature of the information they are to provide, will be off most of the time.

SUMMARY OF THE INVENTION

An object of the invention is, inter alia, to reduce the disadvantages mentioned hereinabove. Specifically, it is an object of the invention to provide an organic EL device capable of displaying a group of icons whilst requiring a modest amount of display area.

This object is achieved by an electroluminescent device as mentioned in the opening paragraph which, in accordance with the invention, is characterized in that
the first electrode layer has an electrode area which is split up into a first and a second electrode which are independently driveable and mutually interlaced,
the second electrode layer serves as a common electrode situated opposite said first and said second electrode,
said electroluminescent device exhibits a first pattern-wise light-emitting surface when driven by means of said first electrode, and
said electroluminescent device exhibits a second pattern-wise light-emitting surface when driven by means of said second electrode.

By providing an electrode area which is split up into (at least) two mutually interlaced electrodes, it is possible to superpose icons, that is to display a group of icons within the same (part of a larger) display area. In this manner, the surface area required to accommodate the group of icons is reduced. In order to be able to display the icons selectively, the first and second electrode must be independently driveable.

When driven, that is when supplying a suitable voltage between the first (second) and the common electrode, the EL device will exhibit a first (second) pattern-wise light-emitting surface, and thus the first (second) icon is switched on.

By mutually interlacing the first and second electrode, the first and second icon are spread out across the same part of the display area. If the spacing between various parts of the first (second) electrode is chosen small enough (which can be readily done by using, for example, photolithography), the image associated with the first (second) electrode, as presented to the unaided eye will, although in fact interrupted by the second (first) electrode, appear to be a continuous image. In the context of the invention, the term interlacing has the same meaning as terms like interlineating, interweaving and interdigitating.

A mutually interlaced first and second electrode can be obtained by, for example, mutually engaging a first and second comb-shaped electrode or, in particular if more than two electrodes are to be interlaced, by mutually intertwisting flat spiral-shaped electrodes.

The EL device in accordance with the invention is not only less complicated in terms of construction than a pixelated EL display device, such as a segmented or matrix EL display device, but it also allows, while employing the same patterning method, images of higher resolution to be displayed.

One of the electrode layers serves as a hole-injecting layer, also referred to as the anode, and the other electrode layer serves as an electron-injecting layer, also referred to as the cathode. At least one of the electrode layers has to be transparent to the light to be emitted.

From the viewpoint of obtaining the benefits of the invention, the choice of the material used for the hole-injecting electrode, the electron-injecting electrode or the emitter layer is not critical. The EL device may include charge-injection and charge-transport layers, while EL devices based on EL compounds of low molecular weight preferably include such layers.

Examples of suitable (transparent) hole-injecting and electron-injecting electrodes and emitter layers containing organic compounds of low molar mass, include those disclosed in the European Patent Applications EP-A-278757 and EP-A-553950. Alternatively, electroluminescent organic compounds of high molecular weight, notably electroluminescent polymers such as a polyphenylenevinylene, may be suitably used. Examples of suitable EL polymers include those disclosed in U.S. Pat. No. 5,247,190.

Preferably, the cathode is used as the common electrode. The common electrode requires less patterning of image-sensitive areas than the first and second electrodes, while cathodic materials are more difficult to pattern due to their high chemical reactivity.

In order to enhance the impression that a continuous image is presented to the unaided eye while in fact it is an image comprising non-contiguous light-emitting areas, a preferred embodiment of the EL device in accordance with the invention is characterized in that the electroluminescent device further comprises a light-scattering layer scattering the light emitted by the electroluminescent device. If comb-shaped electrodes are employed, an anisotropically scattering layer may be effectively used which selectively scatters the emitted light in a direction substantially at right angles to the direction of the teeth of the comb-electrodes.

If a particular location on the surface of the EL device is to be light-emissive, it is necessary to have an area of overlap between the first (second) electrode, one or more electroluminescent areas and the common electrode corresponding to this particular location. Consequently, the common electrode, the first (second) electrode and/or the electroluminescent area can all be patterned so as to manipulate the actually light-emitting surface.

If the first and the second light-emitting surface are chosen to be the same, one of them may be advantageously used as a backup for the other, thus improving the service life and/or the reliability of the EL device. However, if icons differing in shape are to be selectively displayed using the same part of the display area, use is to be made of a preferred embodiment of the electroluminescent device which is characterized in that the first pattern-wise light-emitting surface is different from the second pattern-wise light-emitting surface.

A problem which rarely occurs if a single icon is to be displayed, but which frequently occurs if a group of icons differing in shape are to be selectively displayed using the same part of a display area, is that the shape of the icons happens to be such that a light-emitting surface contains one or more regions completely isolated from other light-emitting regions of said surface. In order to drive such an isolated region, while employing a patterned common electrode an electrical lead to the corresponding common electrode region has to be provided. However, as a result, the electrical lead will itself be part of a light-emitting region, which is a region which, by definition, is not supposed to be light-emitting. This problem can be solved by an embodiment of the EL device in accordance with the invention which is characterized in that the emitter layer comprises electroluminescent areas in accordance with a desired pattern.

If a patterned emitter layer is used, the pattern can simply be chosen such that at those locations where an electric lead is present the emitter layer does not have an electroluminescent area. In fact, the common electrode need not be patterned at all in order to obtain a pattern-wise light-emitting surface but can simply be chosen so as to cover the entire electrode area of the first electrode layer. An example of a suitable patterned emitter layer is disclosed in the International Patent Application WO 97/06223. An alternative solution is to employ a structured electrode layer of the type disclosed in International Patent Application WO 96/08047.

Another preferred embodiment of the electroluminescent device in accordance with the invention is characterized in that the electroluminescent device comprises a color layer having a light-absorbing pattern which covers the first pattern-wise light-emitting surface and leaves the second pattern-wise light-emitting surface uncovered.

By providing the EL device with a patterned color layer, and driving the first and second electrode independently at different voltages, a group of icons differing in color can be selectively displayed using the same part of a display area even when the emission spectrum of the first and second light-emitting surface is the same. Alternatively, different colors may be obtained by driving the electrodes at the same voltage in a pulsed manner, the luminance being controlled by means of the frequency and duration of each pulse.

The light-absorbing pattern is selectively light-absorbing with respect to the light-emitting surface if the emission spectrum of the light-emitting surface and the absorption spectrum of the light-absorbing pattern of the color layer demonstrate a partial overlap. The color layer should not absorb the light at all wavelengths of the emission spectrum, i.e. it is to be selective otherwise the light emitting surface will appear dark.

In addition, in order to obtain a group of icons demonstrating a variety of colors, the second light-emitting surface may be covered by a similar color layer.

The first and second light-absorbing patterns may, but preferably do not, absorb the same part of the spectrum of light emitted by the first and second light-emitting surface.

The first and second light-absorbing patterns may be accommodated by the same layer or separate layers.

The color layers are in fact color filters and their use leads to loss of emitted light. An embodiment of the EL device which is improved in this respect is characterized in that the light-absorbing pattern of the color layer is a photoluminescent pattern.

The loss of light due to absorption of emitted light in the light-absorbing pattern is reduced if absorbed photons are re-emitted or are transferred to and then re-emitted by a photoluminescent material. The photoluminescent material may be present in addition to or may replace the light-absorbing material of the light absorbing pattern. Suitable photoluminescent materials include fluorescent and phosphorescent materials.

Loss of emitted light due to reflection may be reduced by providing the color layer on the light-emitting surface.

The use of a color layer is of particular advantage if the emitter layer contains an electroluminescent polymer. Electroluminescent polymers, in particular polyphenylenevinylenes, emit light within a broad range of wavelengths. The emission spectrum may be 200 to 300 nm wide and substantially overlap the visible light spectrum. Such a broad emission spectrum allows a large variety of colors to be displayed using color layers.

A particularly preferred embodiment of the electroluminescent device in accordance with the invention is characterized in that the light-absorbing pattern is repeated beyond the first pattern-wise light-emitting surface. If the area in which the multi-color icons are to be selectively displayed is only a part of a larger display area, that area will, due to reflection of ambient light from the light-absorbing pattern, display a color different from the rest of the display area even if the EL device is not driven. This undesirable effect may be suppressed by repeating the light-absorbing pattern beyond the light-emitting surface so as to cover the entire display area of the display panel. For example, if use is made of comb-shaped electrodes, the first light-absorbing pattern can be a plurality of stripes running parallel to and covering the teeth of the first comb-shaped electrode.

The EL device in accordance with the invention may be suitably used as a backlight, in particular as a multi-color backlight, in, for example, a liquid crystal display device.

The EL device in accordance with the invention may be suitably used as (part of) a display device, such as a segmented or matrix display device or an illuminated advertisement board, or may be suitably complemented so as to form such a display device.

These and other aspects of the invention will be apparent from and elucidated with reference to the embodiments described hereinafter.

DESCRIPTION OF THE PREFERRED EMBODIMENTS

Exemplary Embodiment 1

Figure 1:
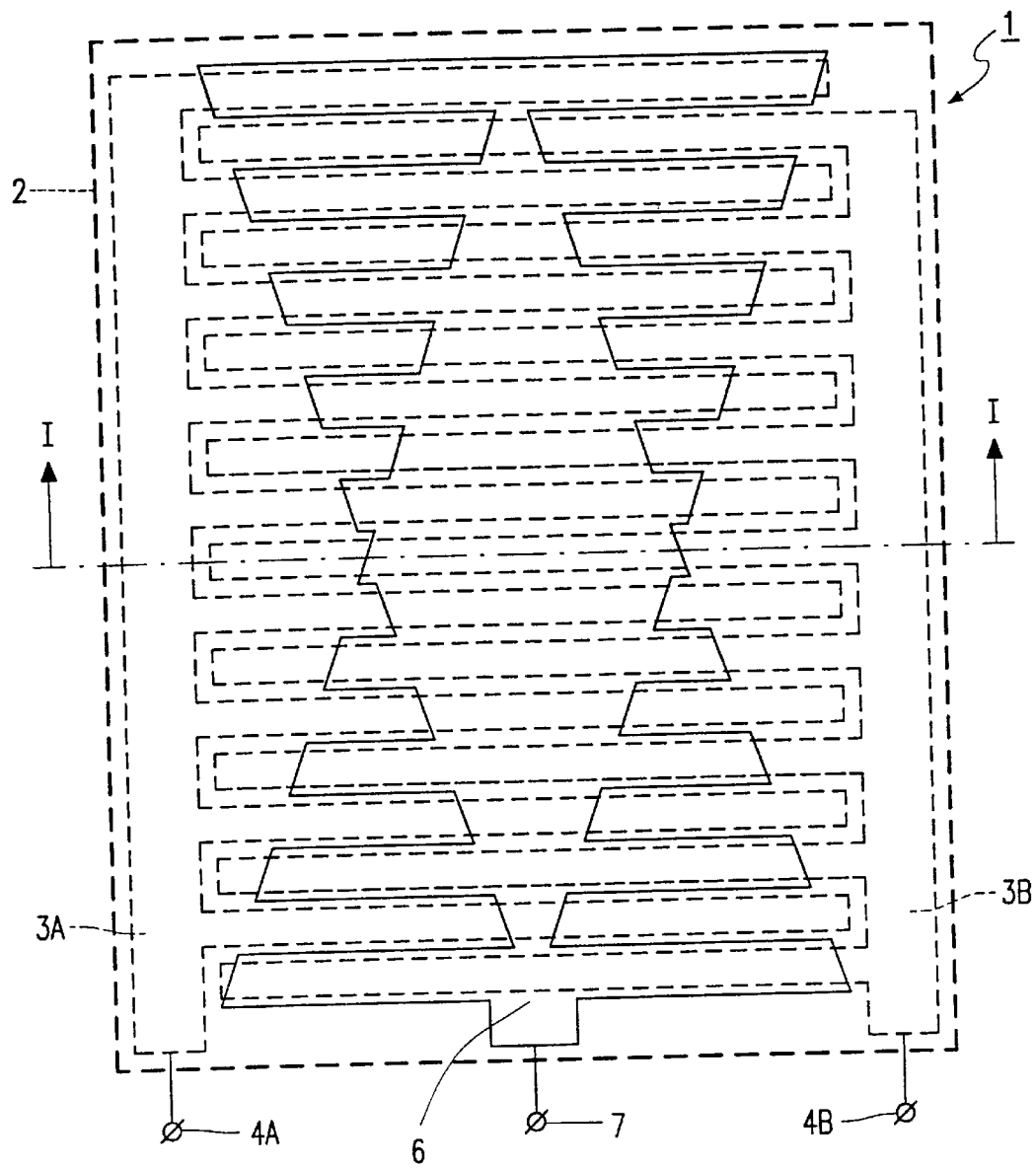
FIG. 1 is a schematic transparent plan view of a first embodiment of an EL device in accordance with the invention.
Figure 2:
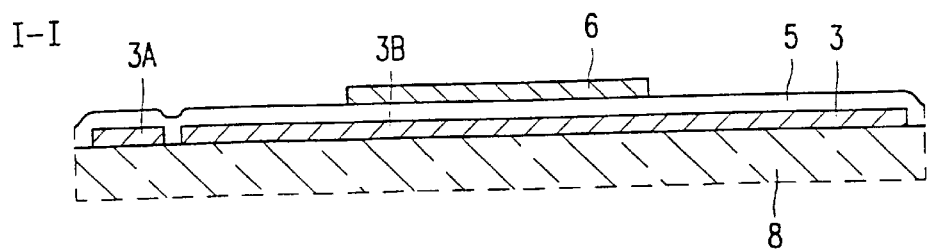
FIG. 2 is a schematic cross-sectional view taken on the line I—I in FIG. 1.

FIG. 1 is a schematic transparent plan view of a first embodiment of an EL device 1 in accordance with the invention. For the sake of clarity, the direction in which the cross-sectional view shown in FIG. 2 is viewed, is drawn enlarged with respect to other directions. The EL device 1 is a display device having a display area of which only a part 2 is shown. The EL device 1 comprises a substrate 8, which in the present embodiment is transparent with respect to the light to be emitted and which is provided with a first electrode layer indicated by the reference sign 3 in FIG. 2. The electrode layer 3 has an electrode area coinciding with the area indicated by the reference sign 2 in FIG. 1 which is split up into a first comb-shaped electrode 3A and a second comb-shaped electrode 3B. The electrodes 3A and 3B can be independently driven by means of the terminals 4A and 4B. The teeth of the combs engage so as to form mutually interlaced electrodes 3A and 3B. In the present example, the electrodes 3A and 3B are transparent with respect to the light to be emitted. The electrode layer 3 is covered by the organic emitter layer 5. In the present example, the emitter layer 5 has an electroluminescent area which encompasses the entire emitter layer. On the emitter layer 5 there is provided a second electrode layer which serves as a common electrode 6 having a pattern in the form of a sand glass and which can be driven by means of the terminal 7.

When a suitable voltage difference is applied between the terminals 4A and 7, while no voltage is applied to the terminal 4B, a first light-emitting surface in accordance with a pattern emerges. Since light emission only occurs at those locations where the electrode 3A and the common electrode 6 demonstrate an overlap, an icon in the form of a triangle pointing downwards is switched on. The spacing between the teeth of the comb-shaped electrode 3A is chosen to be small so as to give the impression of a continuous image to the unaided eye. In a similar manner, when the terminals 4B and 7 are connected to a voltage source, a second pattern-wise light-emitting surface emerges, the pattern representing an icon in the form of a triangle pointing upwards. Thus two different icons are selectively displayed in the same part of the display area. When both light-emitting surfaces are displayed, a third icon in the shape of a sand glass is displayed.

By way of example, the EL device 1 can be manufactured as follows:

A conjugated 2,5-dialkoxy-substituted polyphenylenevinylene, poly[2-methoxy-5-(3,7-dimethyloctyloxy)-p-phenylene vinylene] is prepared by polymerization of 1,4-bischloromethyl-2-methoxy-5-(3,7-dimethyloctyloxy)benzene. The preparation is described in an article by D. Braun et al., Synthetic Metals, 66 (1994) pp 75–79. The polymer is readily soluble, inter alia, in toluene, tetrahydrofuran and xylene.

A transparent indium-tin-oxide (ITO) first electrode layer 3 having a thickness of 150 nm and a surface resistance of less than 20 Ω/square is deposited by means of sputtering onto a glass substrate 8. Said layer 3 serves as the electrode layer for injecting holes into the emitter layer 5 of conjugated poly[2-methoxy-5-(3,7-dimethyloctyloxy)-1,4-phenylene vinylene] which is to be provided later. The ITO is then etched, using a conventional method, in accordance with the pattern shown in FIG. 1 so as to split up the electrode area of the first electrode layer into the first comb-shaped electrode 3A and the second comb-shaped electrode 3B.

Then the 100 nm thick organic emitter layer 5 is manufactured by spin coating an 0.6 wt. % solution of the above-mentioned polymer in toluene at a rate of 1000 r.p.m. for 25 s.

A metal mask in which the sand glass shaped pattern shown in FIG. 1 is cut out is positioned above the emitter layer 5, and by means of vacuum deposition a 150 nm thick layer of Yb in accordance with said pattern is deposited, thereby forming the common electrode 6 which serves as the electron-injecting electrode.

The EL device 1 is now complete. By supplying a voltage of, for example, 5 V to the terminals 4A and 7, using terminal 4A as the positive terminal, an orange-colored light-emitting icon in the form of a triangle pointing upwards emerges.

Exemplary Embodiment 2

Figure 3:
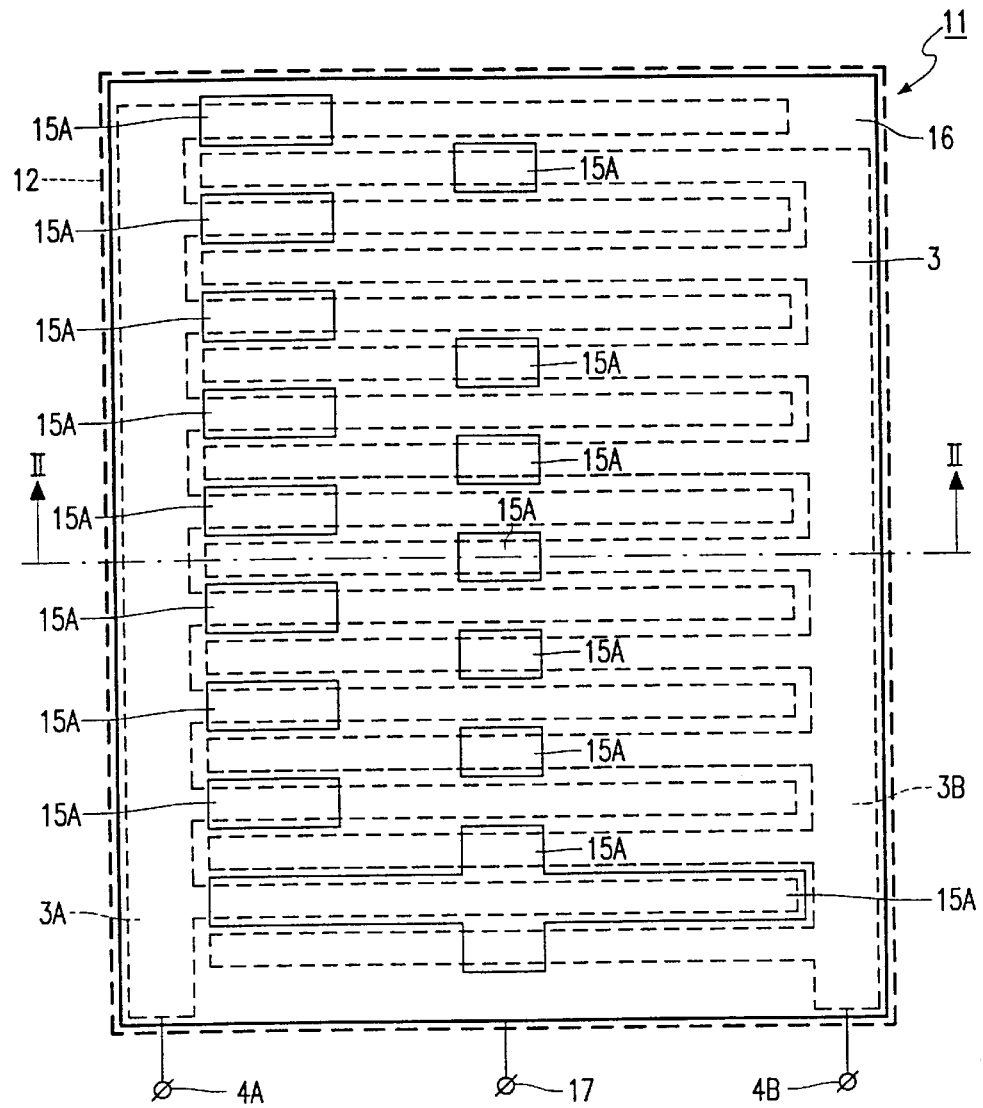
FIG. 3 is a schematic transparent plan view of a second embodiment of an EL device in accordance with the invention.
Figure 4:
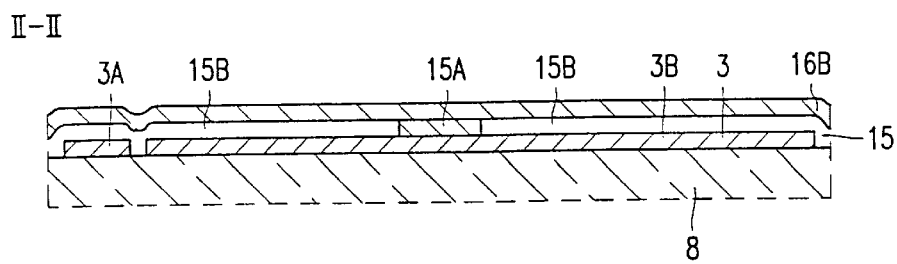
FIG. 4 is a schematic cross-sectional view taken on the line II—II in FIG. 3.

FIG. 3 is a schematic transparent plan view of a second embodiment of an EL device, indicated by the reference sign 11, in accordance with the invention. It is similar to the first embodiment but differs in that the emitter layer is now a patterned emitter layer, indicated by the reference sign 15 in FIG. 4, and the common electrode 16 is not a patterned electrode, at least not inside the part 12 of the display area. The emitter layer 15 is a patchwork-pattern layer having electroluminescent areas 15A and non-electroluminescent areas 15B.

When the EL device 11 is driven by means of terminals 4A and 17, a light-emitting surface in accordance with a pattern will appear, said pattern representing an icon in the form of the letter "L". When the EL device 11 is driven by means of terminals 4B and 17, a second light-emitting surface in accordance with a pattern will appear, said pattern representing an icon in the form of the letter "i".

Note that if these icons are to be represented by an EL device in accordance with the first embodiment described hereinabove, light emission at undesired locations is likely. For example, if in the first embodiment the area corresponding to the dot of the letter "i" is to emit light, the corresponding area of the common electrode must be provided with an electric lead. Given the location of said area, the electric lead will at least overlap the first and/or second electrode, no matter how it is guided, thus giving rise to undesired light-emitting areas.

This second embodiment may be manufactured, for example, by using the method disclosed in the first embodiment, with this difference that before the common electrode 16 is provided, the emitter layer is irradated in accordance with the pattern formed by the areas 15A shown in FIG. 3 and according to a procedure disclosed in International Patent Application WO 97/06223.

Exemplary Embodiment 3

Figure 5:
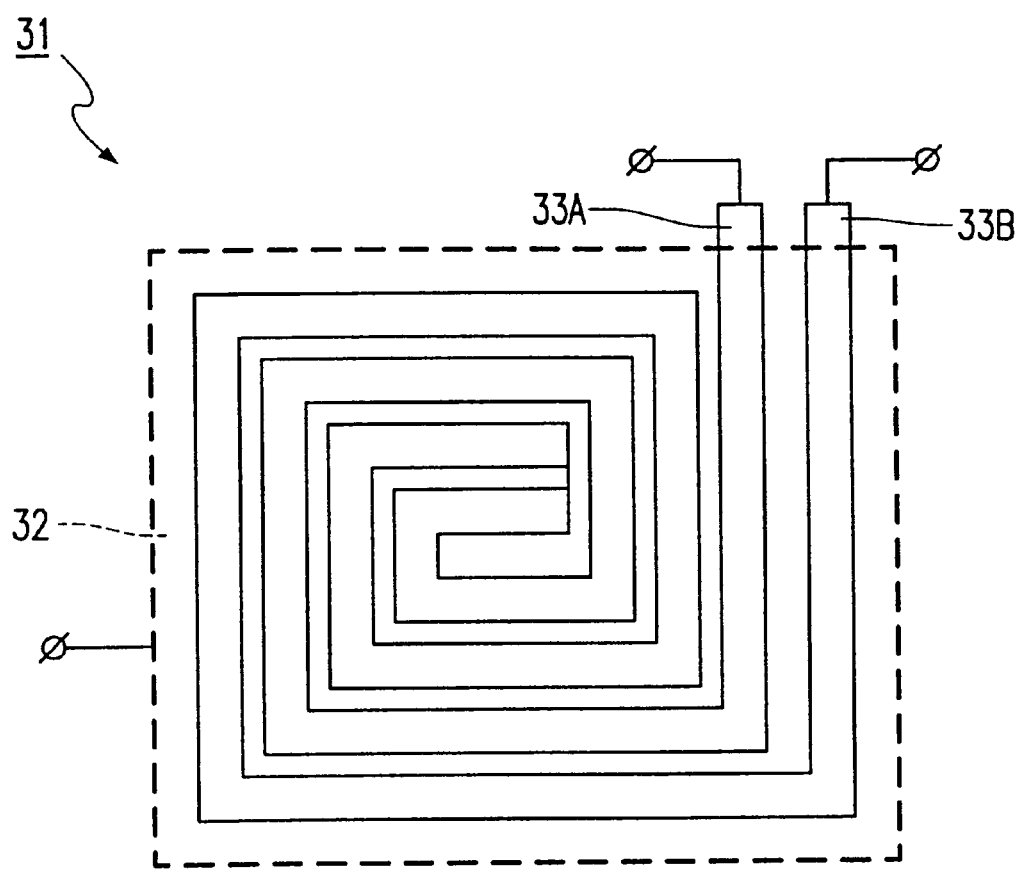
FIG. 5 is a schematic plan view of the electrode arrangement of a third embodiment of an EL device in accordance with the invention.

FIG. 5 is a schematic plan view of the electrode arrangement of a third embodiment of an EL device 31 in accordance with the invention. In this embodiment the electrode area 32 of the first electrode layer of the EL device 31 is split up into flat spiral-shaped electrodes 33A and 33B which are mutually intertwisted.

Exemplary Embodiment 4

Figure 6:
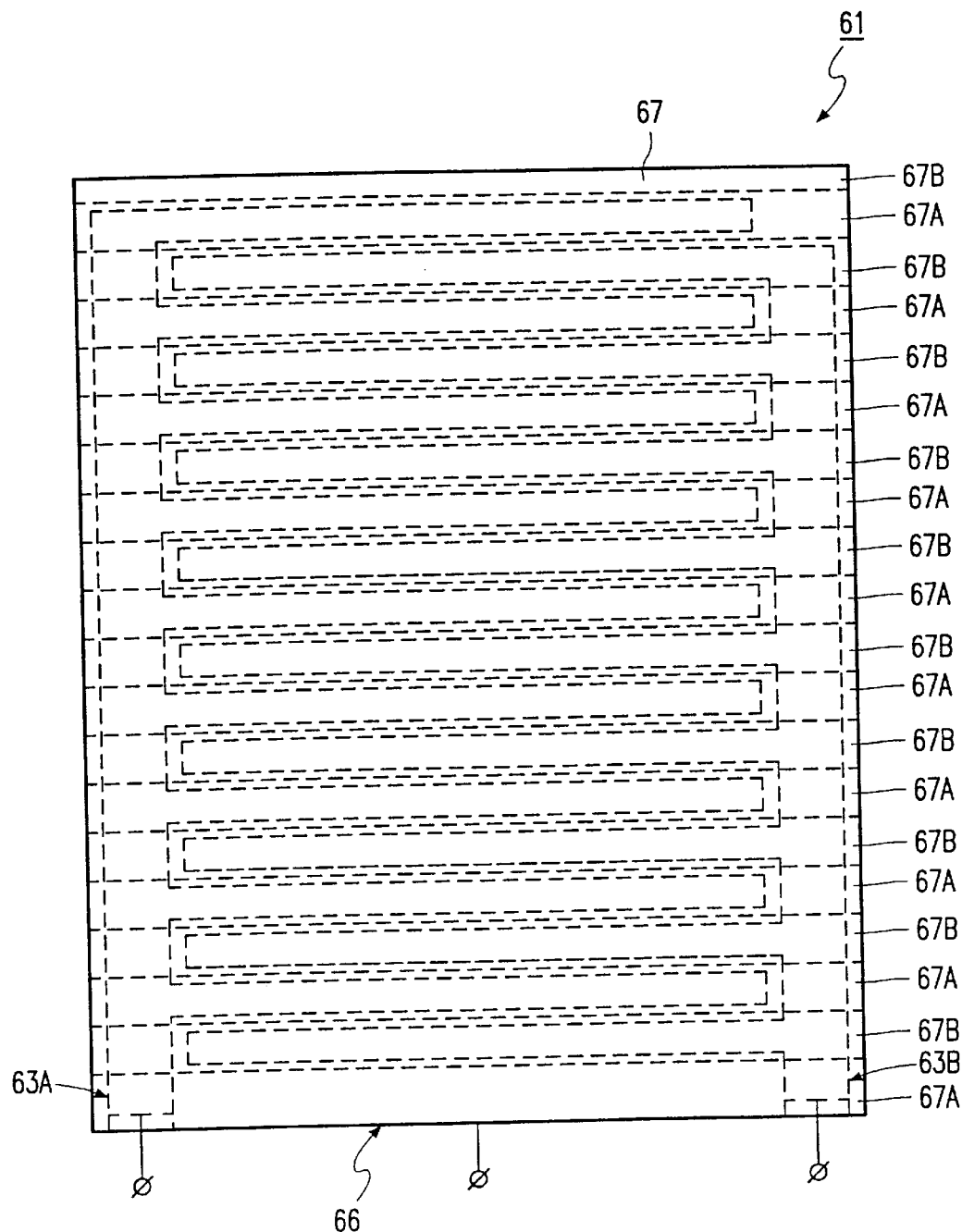
FIG. 6 is a schematic transparent plan view of a fourth embodiment of an EL device in accordance with the invention.

FIG. 6 is a schematic transparent plan view of a fourth embodiment of an EL device 61 in accordance with the invention. The EL device 61 shown in FIG. 6 is a backlight but it may also be (part of) a display area of an EL display device. The EL device 61 has a first and a second comb-shaped electrode 63A and 63B which are mutually interlaced, and a common electrode 66 which entirely covers the first and second electrode. In the present embodiment the pattern of the first (second) light-emitting surface corresponds to the pattern of the electrode 63A (63B). FIG. 6 further shows that the EL device is provided with a color layer 67 which is located on a light-emitting side of said EL device 61. The color layer 67 has a light-absorbing pattern consisting of the stripes 67A which selectively absorbs only a selected range of wavelengths of the light emitted. The stripes 67A cover the teeth of the electrode 63A. The teeth of the second electrode 63B are left uncovered. In fact, the light-absorbing pattern 67A is a pattern which is repeated beyond the teeth of the electrode 63A and is present on the entire surface area of the backlight. In the present embodiment, the stripes 67B together constitute a pattern which is transparent to the light to be emitted. However, the pattern 67B may be a light-absorbing pattern to be accommodated by the color layer 67 or an additional color layer. Since the entire surface area of the EL device 61 is covered by the color layer, the EL device 61, when not driven, will under ambient-light conditions appear to be a homogeneously colored area. When driven by means of the electrodes 63A and 66, a first light-emitting surface of a first color will emerge. When driven by means of the electrodes 63B and 66, a second light-emitting surface of a second color will appear. When driving all three terminals using two different voltages or, preferably, multiplexing in time using voltage pulses of the same voltage but of different duration and frequency, mixed colors between said first and second color will emerge.

Exemplary Embodiment 5

Figure 7:
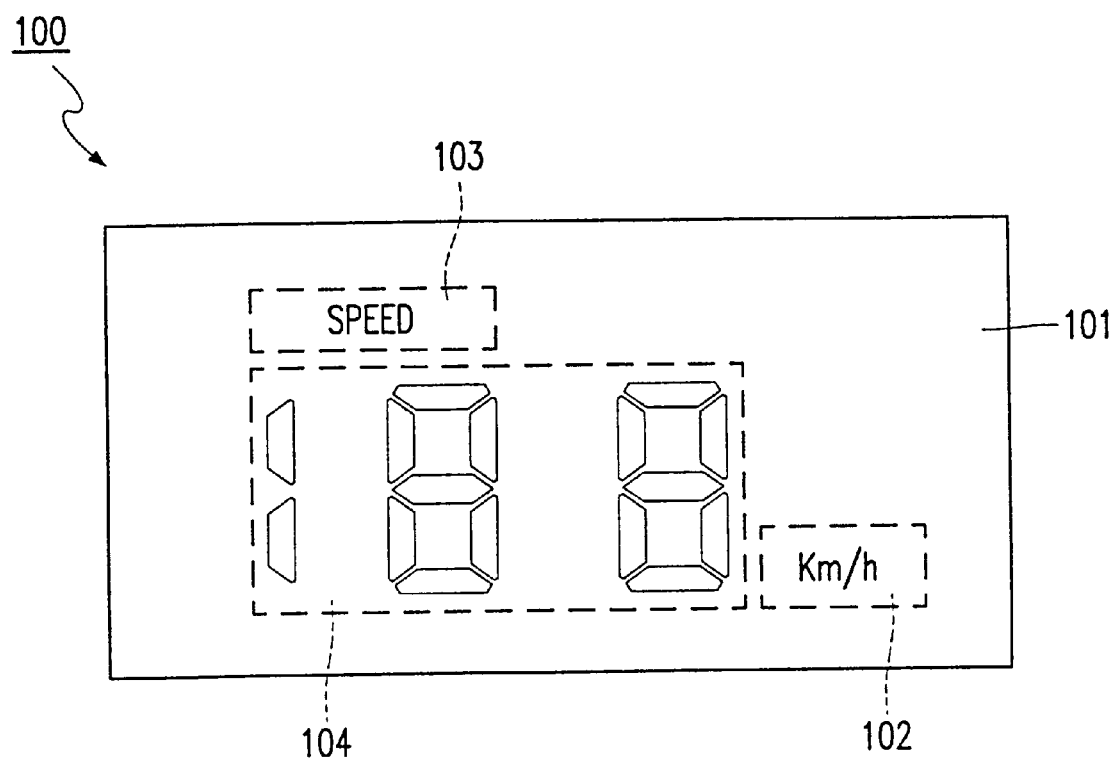
FIG. 7 is a schematic plan view of a fifth embodiment of an EL device in accordance with the invention.

FIG. 7 is a schematic plan view of a fifth embodiment of a composite EL device 100 in accordance with the invention. The EL device 100 is a tachometer and its display panel 101 accommodates EL devices in accordance with the invention, indicated by the reference signs 102 through 104. The EL devices 102 and 103 are parts of the display panel which are capable of displaying a group of icons. Dependent on, for, example the market on which the car comprising the tachometer is to be sold, the area 102 may display either the icon "km/h" or the icon "mi/h" and the area 103 either "SPEED" or "GESCHW". These icons can be represented with a resolution which is far better than the resolution of the segmented EL display 104. The segments of the EL device 104 may have interdigitated comb electrodes and red and green color filters coincident therewith. This arrangement serves to provide a day and night color or may be used to signal speeds below (green) and above (red) the speed limit.

What is claimed is:

1. An electroluminescent device exhibiting a pattern-wise light-emitting surface when driven, said electroluminescent device comprising an organic emitter layer having an electroluminescent area, a first electrode layer and a second electrode layer, said organic emitter layer being disposed between said first and said second electrode layer, characterized in that the first electrode layer has an electrode area which is split up into a first and a second electrode which are independently driveable and mutually interlaced, the second electrode layer serves as a common electrode opposing said first and said second electrode, said electroluminescent device exhibits a first pattern-wise light-emitting surface when driven by means of said first electrode, and said electroluminescent device exhibits a second pattern-wise light-emitting surface when driven by means of said second electrode.

2. An electroluminescent device as claimed in claim 1, characterized in that the electroluminescent device further comprises a light-scattering layer scattering the light emitted by the electroluminescent device.

3. An electroluminescent device as claimed in claim 1, characterized in that the first pattern-wise light-emitting surface is different from the second pattern-wise light-emitting surface.

4. An electroluminescent device as claimed in claim 1, characterized in that the emitter layer comprises electroluminescent areas in accordance with a desired pattern.

5. An electroluminescent device as claimed in claim 1, characterized in that the electroluminescent device comprises a color layer having a light-absorbing pattern covering the first and interlacing with the second pattern-wise light-emitting surface.

6. An electroluminescent device as claimed in claim 5, characterized in that the electroluminescent device comprises a color layer having a light-absorbing pattern which covers the first pattern-wise light-emitting surface and leaves the second pattern-wise light-emitting surface uncovered.

7. An electroluminescent device as claimed in claim 5, characterized in that the light-absorbing pattern of the color layer is a photoluminescent pattern.

8. An electroluminescent device as claimed in claim 5, characterized in that the organic emitter layer contains a polyphenylenevinylene.

9. An electroluminescent device as claimed in claim 5, characterized in that the light-absorbing pattern is repeated beyond the first pattern-wise light-emitting surface.

* * * * *